United States Patent
Hirose et al.

(10) Patent No.: US 11,231,121 B2
(45) Date of Patent: Jan. 25, 2022

(54) ACTUATOR, VALVE DEVICE, AND FLUID CONTROL APPARATUS

(71) Applicant: FUJIKIN INCORPORATED, Osaka (JP)

(72) Inventors: Takashi Hirose, Osaka (JP); Masahiko Nakazawa, Osaka (JP); Nobuo Nakamura, Osaka (JP); Tomoko Yuhara, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 17/162,489

(22) Filed: Jan. 29, 2021

(65) Prior Publication Data
US 2021/0199210 A1 Jul. 1, 2021

Related U.S. Application Data

(63) Continuation of application No. PCT/JP2019/021983, filed on Jun. 3, 2019.

(30) Foreign Application Priority Data

Jul. 31, 2018 (JP) .............................. JP2018-143972

(51) Int. Cl.
*F16K 31/00* (2006.01)
*H02N 2/04* (2006.01)
(Continued)

(52) U.S. Cl.
CPC ........... *F16K 31/006* (2013.01); *F16H 21/44* (2013.01); *F16K 31/047* (2013.01);
(Continued)

(58) Field of Classification Search
CPC .... F16K 31/004; F16K 31/007; F16K 31/047; F16K 31/10; F16K 31/16;
(Continued)

(56) References Cited

U.S. PATENT DOCUMENTS 1,967,418 A * 7/1934 McPhail ................. F16K 15/12
137/516.21
2,310,570 A * 2/1943 Briggs ..................... F16F 9/52
188/276
(Continued)

FOREIGN PATENT DOCUMENTS

JP S63262065 A 10/1988
JP H01210673 A 8/1989
JP 2003199366 A 7/2003

OTHER PUBLICATIONS

International Search Report for International Application No. PCT/JP2019/021983; dated Aug. 13, 2019.

*Primary Examiner* — William M McCalister
(74) *Attorney, Agent, or Firm* — Cantor Colburn LLP

(57) ABSTRACT

A first lever portion includes a first point-of-effort portion, a first fulcrum portion, and a first point-of-load portion. A second lever portion has a second point-of-effort portion, a second fulcrum portion, and a second point-of-load portion. A first point-of-effort portion is located between a first fulcrum portion and a first point-of-load portion in a direction orthogonal to an axis of a stem. A second fulcrum portion is located between a second point-of-effort portion and a second point-of-load portion in the direction orthogonal to the axis. A distance between the second fulcrum portion and the second point-of-load portion is configured longer than a distance between the second fulcrum portion and the second point-of-effort portion. The second point-of-load portion of the second lever portion is displaced toward the stem and moves the stem toward the piezoelectric element by means of displacement of the intermediate member to the second lever portion side.

5 Claims, 5 Drawing Sheets

(51) Int. Cl.
*H01L 41/053* (2006.01)
*F16H 21/44* (2006.01)
*F16K 31/04* (2006.01)

(52) U.S. Cl.
CPC ........... *H01L 41/0536* (2013.01); *H02N 2/04* (2013.01); *F16K 31/004* (2013.01); *F16K 31/007* (2013.01); *F16K 2200/3052* (2021.08)

(58) Field of Classification Search
CPC ..... F16K 2200/3051; F16K 2200/3052; H01L 41/053; H01L 41/0536; F16H 21/44; H02N 2/04
USPC ............. 251/129.2, 242, 243, 244, 245, 246
See application file for complete search history.

(56) References Cited

U.S. PATENT DOCUMENTS

| | | | | |
|---|---|---|---|---|
| 2,634,123 A * | 4/1953 | Eldon | F16F 3/02 | 267/162 |
| 2,777,461 A * | 1/1957 | Wildhaber | G01F 23/241 | 141/198 |
| 2,989,982 A * | 6/1961 | Soderberg | G05D 16/0655 | 137/505.22 |
| 3,302,662 A * | 2/1967 | Webb | F16K 15/046 | 137/539 |
| 3,690,460 A * | 9/1972 | Lindboe | B01D 27/106 | 210/130 |
| 3,757,910 A * | 9/1973 | Palmer | F16F 9/348 | 188/322.14 |
| 3,812,766 A * | 5/1974 | Weiss | F15B 15/204 | 92/14 |
| 3,970,281 A * | 7/1976 | Heeb | F16K 51/02 | 251/77 |
| 4,212,320 A * | 7/1980 | Stoll | F16K 31/385 | 137/625.6 |
| 4,381,796 A * | 5/1983 | Stockli | G05D 16/0641 | 137/224 |
| 4,540,354 A * | 9/1985 | Tuckey | F04C 11/008 | 137/512.15 |
| 4,549,719 A * | 10/1985 | Baumann | F16H 25/183 | 100/291 |
| 4,569,504 A * | 2/1986 | Doyle | H01F 7/1638 | 251/129.15 |
| 4,593,658 A * | 6/1986 | Moloney | F01L 9/20 | 123/90.11 |
| 4,609,178 A * | 9/1986 | Baumann | F16H 25/183 | 251/229 |
| 4,729,544 A * | 3/1988 | Baumann | F16H 21/44 | 251/129.05 |
| 4,955,582 A * | 9/1990 | Baumann | F16K 7/123 | 251/331 |
| 5,211,341 A * | 5/1993 | Wieczorek | F02M 51/065 | 239/585.3 |
| 5,211,372 A * | 5/1993 | Smith, Jr. | F01L 25/08 | 251/129.19 |
| 5,314,164 A * | 5/1994 | Smith | F16K 31/0682 | 251/129.17 |
| 5,516,075 A * | 5/1996 | Itoi | F16K 31/163 | 251/58 |
| 6,059,259 A * | 5/2000 | Gregoire | F16K 7/14 | 251/331 |
| 6,213,448 B1 * | 4/2001 | Hayakawa | F16K 1/36 | 251/129.15 |
| 6,547,214 B2 * | 4/2003 | Gregoire | F16K 17/048 | 251/58 |
| 6,764,286 B2 * | 7/2004 | Hunnicutt | B60T 8/4031 | 417/470 |
| 6,786,238 B2 * | 9/2004 | Frisch | F16K 31/0682 | 137/625.44 |
| 9,151,403 B2 * | 10/2015 | Webster | F16K 31/1221 | |
| 9,416,893 B2 * | 8/2016 | Yakushijin | F16K 27/0236 | |
| 2003/0038259 A1* | 2/2003 | Boecking | F02M 63/0026 | 251/129.06 |
| 2004/0061084 A1* | 4/2004 | Baumann | F16K 31/1262 | 251/58 |
| 2005/0236438 A1* | 10/2005 | Chastine | B05C 5/0237 | 222/504 |
| 2005/0269534 A1* | 12/2005 | Tanikawa | F16K 31/165 | 251/63.5 |
| 2008/0054214 A1* | 3/2008 | Olberding | F16K 31/1262 | 251/242 |
| 2011/0315251 A1* | 12/2011 | Rampen | F16K 31/408 | 137/561 R |
| 2012/0012767 A1* | 1/2012 | Leiser | F16K 31/0689 | 251/129.01 |
| 2015/0322829 A1* | 11/2015 | Cho | F01L 9/20 | 123/90.11 |
| 2020/0248833 A1* | 8/2020 | Nakazawa | F16H 21/44 | |

* cited by examiner

ACTUATOR, VALVE DEVICE, AND FLUID CONTROL APPARATUS

CROSS REFERENCE TO RELATED APPLICATION

This application is a continuation under 35 U.S.C. § 120 of PCT/JP2019/021983, filed Jun. 3, 2019, which is incorporated herein reference and which claimed priority to Japanese Application No. 2018-143972, filed Jul. 31, 2018. The present application likewise claims priority under 35 U.S.C. § 119 to Japanese Application No. 2018-143972, filed Jul. 31, 2018, the entire content of which is also incorporated herein by reference.

TECHNICAL FIELD

The present disclosure relates to an actuator, a valve device, and a fluid control apparatus used for a fluid pipeline of a semiconductor manufacturing apparatus and the like.

BACKGROUND

A valve device using a piezoelectric element in an actuator and having a mechanism for amplifying a displacement amount of the piezoelectric element is proposed in Japanese Patent Application Publication No. 2003-199366.

SUMMARY

However, since the valve device disclosed in Japanese Patent Application Publication No. 2003-199366 is in a normally open state, it cannot be applied to a semiconductor manufacturing device and the like requiring a valve device in a normally closed state.

Thus, it is an object of the present disclosure to provide an art which can amplify a displacement amount of a piezoelectric element and can realize a normally closed state of a valve device.

An actuator according to one or more embodiments includes: a casing; a stem provided in the casing; a piezoelectric element supported by the casing to be displaced toward the stem; and a displacement amplification mechanism configured to amplify displacement of the piezoelectric element, wherein the displacement amplification mechanism includes a first lever portion, an intermediate member, and a second lever portion; the first lever portion is located between the piezoelectric element and the intermediate member and includes a first point-of-effort portion configured to receive displacement from the piezoelectric element, a first fulcrum portion which is in contact with the casing and becomes a center of rotational movement of the first lever portion, and a first point-of-load portion configured to transmit displacement to the intermediate member; the intermediate member is located between the first lever portion and the second lever portion and is configured to be displaced toward the second lever portion upon receipt of displacement from the first lever portion; and the second lever portion has a second point-of-effort portion configured to receive displacement from the intermediate member, a second fulcrum portion which is in contact with the casing and becomes the center of rotational movement of the second lever portion, and a second point-of-load portion configured to transmit the displacement to the stem; the first point-of-effort portion is located between the first fulcrum portion and the first point-of-load portion in a direction orthogonal to an axis of the stem; the second fulcrum portion is located between the second point-of-effort portion and the second point-of-load portion in the direction orthogonal to the axis of the stem; a distance between the second fulcrum portion and the second point-of-load portion is configured longer than a distance between the second fulcrum portion and the second point-of-effort portion; and the second point-of-load portion of the second lever portion is displaced toward the stem and moves the stem toward the piezoelectric element by means of displacement of the intermediate member to the second lever portion side.

Further, a valve device according to one or more embodiments of the present disclosure invention includes: body in which a fluid passage is formed; a valve body configured to open and close the fluid passage; and the above actuator.

A fluid control apparatus according to one or more embodiments of the present disclosure includes: a plurality of fluid control devices, wherein at least one of the plurality of fluid control devices is the above valve device.

DETAILED DESCRIPTION

Figure 1:
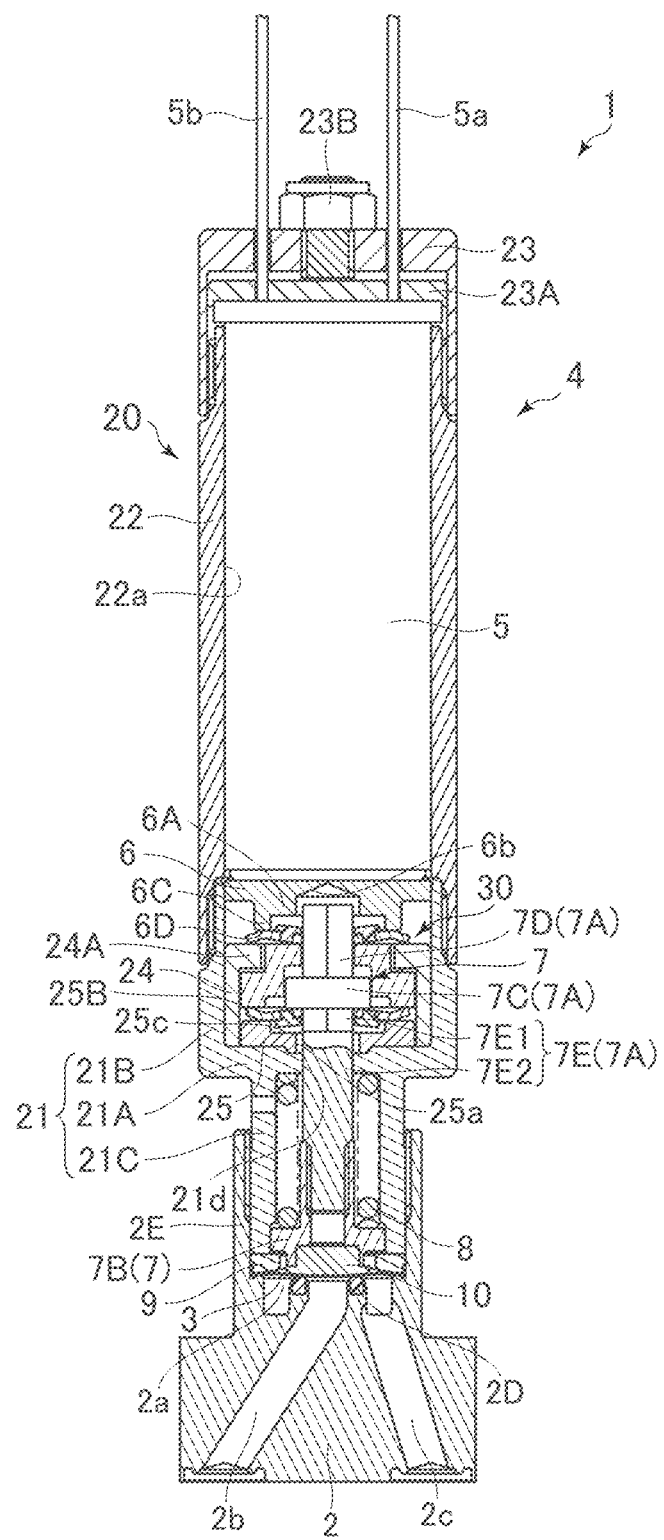
FIG. 1 is a vertical cross-sectional view of a valve device in a closed state according to an embodiment of the present disclosure.

Referring to the drawings, a description will be given of an actuator, a valve device, and a fluid control apparatus each according to an embodiment of the present disclosure.

FIG. 1 illustrates a vertical cross-sectional view of a valve device 1 in a closed state in this embodiment. As illustrated in FIG. 1, the valve device 1 is a diaphragm valve for use in a gas line (e.g., on a most upstream side of the gas line) including a plurality of fluid controllers of a fluid control apparatus 55 (see FIG. 5).

The valve device 1 includes a body 2, a diaphragm 3, and an actuator 4. Note that the description will be given below on the assumption that the actuator 4 is on an upper side of the valve device 1, while the body 2 is on a lower side of the valve device 1.

In the body 2, a columnar valve chamber 2a and an inflow passage 2b as well as an outflow passage 2c communicating with the valve chamber 2a are formed. An annular seat 2D protruding toward a stem 7 of the actuator 4 is provided on a peripheral edge at a spot where the inflow passage 2b and the valve chamber 2a of the body 2 communicate with each other (an opening part of the inflow passage 2b). The seat 2D is constituted of a resin material or the like. Moreover, the body 2 has a cylindrical portion 2E provided so as to extend upward, having a cylindrical shape, and having a female thread portion formed on an inner peripheral part.

The diaphragm 3 is constituted of a plurality of diaphragms and is disposed in the valve chamber 2a. The diaphragm 3 has an outer peripheral edge portion sandwiched by an annular retaining adapter 9 which will be described later and is held with respect to the body 2. The diaphragm 3 which is a valve stem has a substantially spherical shell shape and has a substantially arc shape projecting upward in a natural state. The diaphragm 3 is brought into contact with and separated from the seat 2D, whereby communication or shut-off between the inflow passage 2b and the outflow passage 2c is performed. When the valve device 1 is in a closed state, the diaphragm 3 is brought into contact with the seat 2D, whereby the inflow passage 2b and the outflow passage 2c are shut off. When the valve device 1 is in the open state, the diaphragm 3 is separated from the seat 2D, whereby the inflow passage 2b and the outflow passage 2c communicate with each other.

The actuator 4 has a casing 20, a piezoelectric element 5, a disc 6, the stem 7, a coil spring 8, a retaining adapter 9, a diaphragm retainer 10, and a displacement amplification mechanism 30.

The casing 20 includes a bonnet 21, an intermediate casing 22, a cap 23, a first support ring 24, and a second support ring 25 and has a substantially capped cylindrical shape as a whole.

The bonnet 21 has a substantially cylindrical shape and has a base portion 21A, an upper cylindrical portion 21B, and a lower cylindrical portion 21C. The base portion 21A has a disc shape having a through hole 21d. The upper cylindrical portion 21B has a cylindrical shape and protrudes to an upper side from an outer peripheral edge of the base portion 21A. A male thread portion is formed on an outer periphery of an upper end portion of the upper cylindrical portion 21B. The lower cylindrical portion 21C has a cylindrical shape and protrudes to a lower side from a position between the through hole 21d of the base portion 21A and the outer peripheral edge. A male thread portion is formed on an outer periphery of the lower cylindrical portion 21C. The male thread portion of the lower cylindrical portion 21C of the bonnet 21 is screwed with the female thread portion of the cylindrical portion 2E of the body 2 so as to be fixed to the body 2.

The intermediate casing 22 has a substantially cylindrical shape having a through hole 22a. A female thread portion is formed on an inner periphery of a lower end portion of the intermediate casing 22, and a male thread portion is formed on an outer periphery of an upper end portion. The female thread portion on the lower end portion of the intermediate casing 22 is screwed with the male thread portion of the upper cylindrical portion 21B of the bonnet 21, whereby the intermediate casing 22 is fixed to the bonnet 21.

The cap 23 has a capped cylindrical shape. A female thread portion is formed on an inner periphery of a lower end portion of the cap 23. The female thread portion on the lower end portion of the cap 23 is screwed with the male thread portion on the upper end portion of the intermediate casing 22, whereby the cap 23 is fixed to the intermediate casing 22. Moreover, a plate 23A and a lock nut 23B are provided on the cap 23.

The first support ring 24 has a substantially cylindrical shape and is disposed on the base portion 21A of the bonnet 21. An annular projecting portion 24A protruding inward is provided on the upper end portion of the first support ring 24. An outer diameter of the first support ring 24 is configured slightly smaller than an inner diameter of the upper cylindrical portion 21B of the bonnet 21.

The second support ring 25 has a substantially disc shape having a through hole 25a and is disposed on the base portion 21A of the bonnet 21. A recess portion 25c is formed at a center part of an upper surface 25B of the second support ring 25. The second support ring 25 is provided on an inner side of the first support ring 24, and an outer diameter of the second support ring 25 is constituted slightly smaller than an inner diameter of the first support ring 24.

The piezoelectric element 5 is disposed on the disc 6 which will be described later and is provided in the intermediate casing 22. A pair of lead terminals 5a and 5b is connected to the piezoelectric element 5, and the lead terminals 5a and 5b extend to an outside through the cap 23 and the plate 23A. When a predetermined voltage is applied to the pair of lead terminals 5a and 5b, the piezoelectric element 5 is deformed by an inverse piezoelectric effect. In the piezoelectric element 5, deformation of the upper end thereof to an upper side is regulated by the plate 23A and the lock nut 23B, the deformation of the piezoelectric element 5 is transmitted to a lower side, and the disc 6 is displaced. The displacement amount of the disc 6 by the deformation of the piezoelectric element 5 is adjusted by adjusting a tightening amount of the lock nut 23B.

The disc 6 is located on the lower side of the piezoelectric element 5 and is provided movably in a vertical direction in the upper cylindrical portion 21B of the bonnet 21. A projecting portion 6A protruding downward is provided on a lower surface side of the disc 6. A recess portion 6b recessed upward is formed at a center part of the projecting portion 6A. An annular projecting portion 6C protruding downward is provided on an outer peripheral edge of the projecting portion 6A. A lower surface 6D of the projecting portion 6C forms a planar shape.

The stem 7 is located on the lower side of the disc 6 and is provided movably in the vertical direction. The stem 7 has an upper stem 7A and a lower stem 7B. The upper stem 7A has a disc portion 7C, an upper extension portion 7D, and a lower extension portion 7E. The disc portion 7C has a disc shape and is located within the upper cylindrical portion 21B of the bonnet 21. An outer diameter of the disc portion 7C is configured larger than outer diameters of the upper extension portion 7D and the lower extension portion 7E.

The upper extension portion 7D has a regular hexagonal prism shape and extends to an upper side from the center part of the disc portion 7C. An upper end of the upper extension portion 7D is located within the recess portion 6b of the disc 6 but is configured so that the stem 7 does not touch the disc 6 even if the stem 7 moves vertically. The lower extension portion 7E extends to the lower side from the center part of the disc portion 7C. The lower extension portion 7E has a regular hexagonal prism portion 7E1 and a columnar portion 7E2. The regular hexagonal prism portion 7E1 is located on the lower side of the disc portion 7C, and the columnar portion 7E2 is located on the lower side of the regular hexagonal prism portion 7E1. The columnar portion 7E2 penetrates the through hole 25a of the second support ring 25 and the through hole 21d of the base portion 21A, the lower end portion of the columnar portion 7E2 is located within the lower cylindrical portion 21C, and a male thread portion is formed on an outer periphery thereof.

The lower stem 7B has a substantially cylindrical shape and is located within the lower cylindrical portion 21C. A female thread portion is formed on an inner periphery of the upper end portion of the lower stem 7B. The female thread portion on the upper end portion of the lower stem 7B is screwed with the male thread portion on the lower end portion of the upper stem 7A, whereby the lower stem 7B is fixed to the upper stem 7A.

The coil spring 8 is provided in the lower cylindrical portion 21C, is interposed between the base portion 21A and the lower stem 7B, and biases the stem 7 to the lower side at all times.

The retaining adapter 9 has an annular shape, sandwiches the outer peripheral edge portion of the diaphragm 3 and holds the diaphragm 3 to the body 2.

The diaphragm retainer 10 is provided on the lower side of the stem 7 and is capable of pressing the center part of the diaphragm 3.

Subsequently, the displacement amplification mechanism 30 will be described.

Figure 2A:
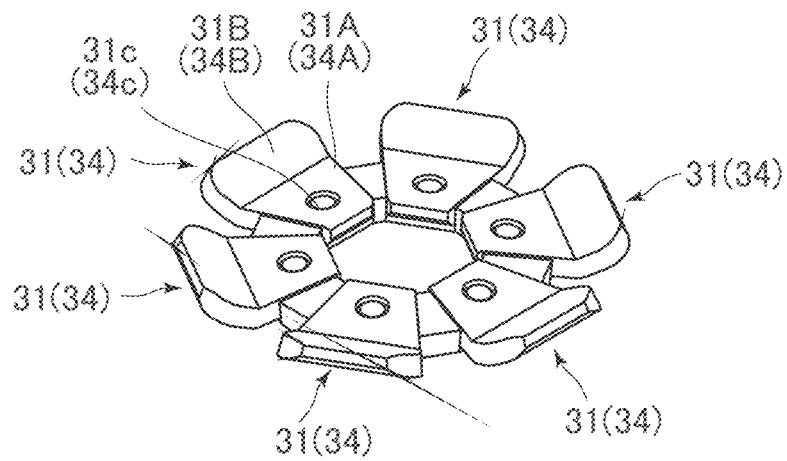
FIG. 2A is a perspective view illustrating a state in which first levers (second levers) and a first retainer (second retainer) are assembled.
Figure 2B:
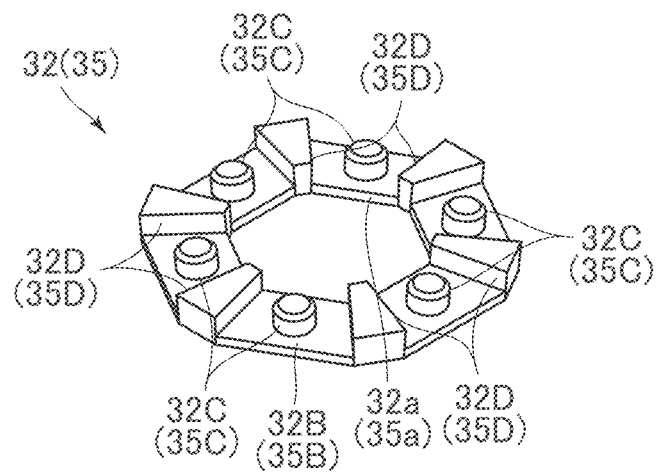
FIG. 2B is a perspective view of the first retainer (second retainer)
Figure 2C:
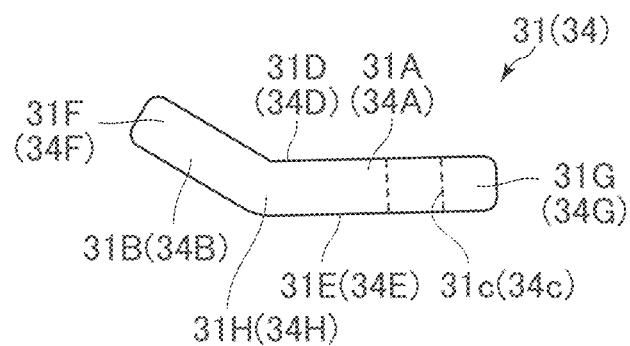
FIG. 2C is a side view of the first lever (the second lever).

FIG. 2A illustrates a perspective view of a state where first levers 31 (second levers 34) and a first retainer 32 (second retainer 35) are assembled, FIG. 2B illustrates a perspective view of the first retainer 32 (second retainer 35), and FIG. 2C illustrates a side view of the first lever 31 (second lever 34). The first lever 31 and the first retainer 32 in FIG. 2A to FIG. 2C illustrate a vertically inverted state of the first lever 31 and the first retainer 32 illustrated in FIG. 1 and FIG. 3. Thus, in FIG. 2A to FIG. 2C, the first lever 31 and the first retainer 32 in the vertically inverted state will be described.

The displacement amplification mechanism 30 includes six first levers 31, first retainers 32, an intermediate member 33 and six second levers 34, second retainers 35. The six first levers 31 correspond to a first lever portion, and the six second retainers 35 correspond to a second lever portion.

The six first levers 31 are independent of each other, have the same shape, and are equidistantly arranged around the upper extension portion 7D along a circumferential direction of the casing 20. Each of the first levers 31 is formed of a metal (e.g., stainless steel), a resin, a ceramic, or the like and has hardness which keeps the first lever 31 from being deformed (distorted) during an operation of opening/closing the valve device 1 described later. In other words, each of the first levers 31 functions as a rigid body against the operation of opening/closing the valve device 1.

Each of the first levers 31 includes an inner portion 31A and an outer portion 31B and has a shape tapered from the outer portion 31B toward the inner portion 31A. The outer portion 31B is connected to the inner portion 31A so as to be bent upwardly. The inner portion 31A has an insertion hole 31c formed therein.

As illustrated in FIG. 2C, the first lever 31 has a first main surface 31D and a second main surface 31E. Portions constituting the inner portion 31A and the outer portion 31B of the first main surface 31D and the second main surface 31E form planar shapes, respectively.

Figure 3:
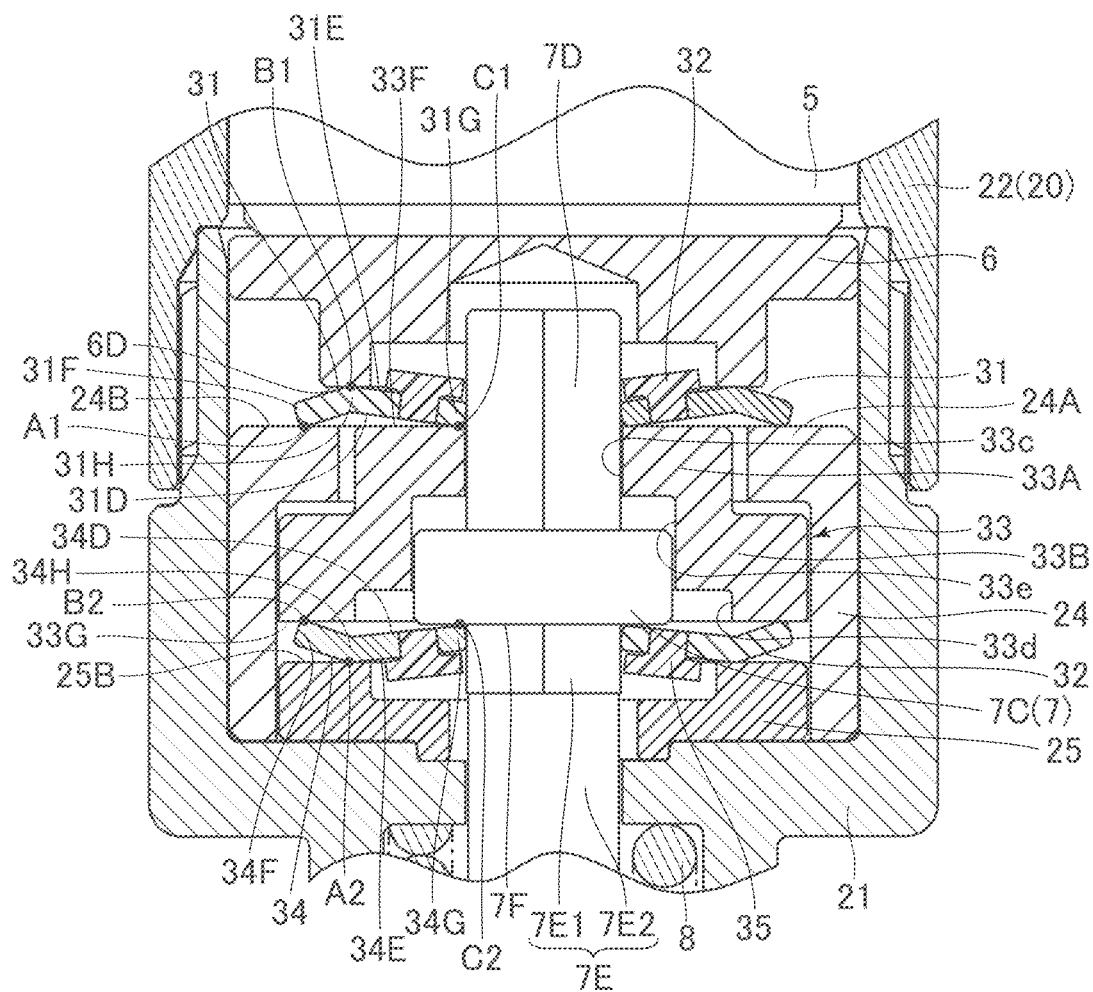
FIG. 3 is a cross-sectional view of a displacement amplification mechanism when the valve device is in the closed state.

An outer end portion 31F and an inner end portion 31G of each of the first levers 31 extend so as to be in parallel with a tangent direction of a circle with an axis of the stem 7 as the center. As illustrated in FIG. 3, each of the first levers 31 is disposed so that the first main surface 31D is directed to the lower side, and the second main surface 31E to the upper side, and the outer end portion 31F of each of the first levers 31 is in linear contact with an upper surface 24B of the projecting portion 24A of the first support ring 24, and the inner end portion 31G is in linear contact with an upper surface 33F of the intermediate member 33 while facing each surface of the regular hexagonal prism of the upper extension portion 7D of the stem 7. Moreover, the lower surface 6D of the disc 6 is in linear contact with a bent portion 31H of the first lever 31 in the second main surface 31E.

The first retainer 32 is formed of a flexible material such as rubber, has a substantially hexagonal shape in plan view, and has a regular hexagonal insertion hole 32a formed therein. The first retainer 32 includes an annular portion 32B, six first projections 32C, and six second projections 32D.

Each of the six first projections 32C has a substantially cylindrical shape. The six first projections 32C are arranged over the annular portion 32B so as to be equidistant from each other in the circumferential direction of the actuator 3.

Each of the six second projections 32D is provided between the first projections 32C adjacent to each other and has a shape tapered toward a center of the annular portion 32B in plan view.

Into the insertion holes 31c of the inner portions 31A of the individual first levers 31, the first projections 32C of the first retainer 32 are inserted to allow each of the first levers 31 to be held by the first retainer 32. Each of the first levers 31 is disposed between the second projections 32D adjacent to each other to have rotation thereof suppressed.

Into the regular hexagonal insertion hole 32a of the annular portion 32B, the upper extension portion 7D in the form of the regular hexagonal prism is inserted. Since the insertion hole 32a has a size slightly larger than that of an outer shape of the upper extension portion 7D, the rotation of the first retainer 32 relative to the upper extension portion 7D is suppressed.

The intermediate member 33 has a substantially annular shape and is located on the lower sides of the first lever 31 and the first retainer 32 as illustrated in FIG. 3. The intermediate member 33 has an upper transmission portion 33A and a lower transmission portion 33B. The upper transmission portion 33A is located on the inner side of the projecting portion 24A of the first support ring 24. An upper through hole 33c having a regular hexagonal prism shape is formed at a center part of the upper transmission portion 33A. A dimension of the upper through hole 33c is configured slightly larger than the dimension of the upper extension portion 7D. The upper extension portion 7D penetrates the upper through hole 33c.

A columnar intermediate through hole 33e is formed on the upper transmission portion 33A side of the lower transmission portion 33B, and a lower through hole 33d is formed on the lower side thereof. An inner diameter of the intermediate through hole 33e is configured slightly larger than an outer diameter of the disc portion 7C of the stem 7. The disc portion 7C is capable of vertical movement along an inner periphery of the intermediate through hole 33e. An inner diameter of the lower through hole 33d is configured larger than the inner diameter of the intermediate through hole 33e.

The six second levers 34 and the second retainer 35 are located under the transmission member 33 and have the same configurations/shapes as those of the six first levers 31 and the first retainer 32 as illustrated in FIG. 2A to FIG. 2C.

Specifically, each of the second levers 34 is made of a metal (e.g., stainless steel), a resin, a ceramic, or the like, has hardness which keeps the second lever 34 from being deformed (distorted) during the operation of opening/closing of the valve device 1 described later, and includes the inner portion 34A having an engagement hole 34c formed therein, and an outer side portion 34B. An outer end portion 34F and an inner end portion 34G of each of the second levers 34 extend so as to be in parallel with a tangent direction of a circle with an axis of the stem 7 as the center. As illustrated in FIG. 2C, the first lever 34 has a third main surface 34D and a fourth main surface 34E. Portions constituting an inner side portion 34A and an outer side portion 34B of the third main surface 34D and the fourth main surface 34E form planar shapes, respectively.

As illustrated in FIG. 3, the six second levers 31 are equidistantly arranged around the regular hexagonal prism portion 7E1 along a circumferential direction of the casing 20. Each of the second levers 34 is disposed so that the third main surface 34D is directed to the upper side, and the fourth main surface 34E to the lower side, and the outer end portion 34F of each of the second levers 34 is in linear contact with a lower surface 33G of the intermediate member 33, and the inner end portion 34G is in linear contact with a lower surface 7F of the disc portion 7C of the stem 7 while facing each surface of the regular hexagonal prism portion 7E1. Further, an upper surface 25B of the second support ring 25 is in linear contact with a bent portion 34H of the second lever 34 in the second main surface 34E.

The second retainer 35 is formed of a flexible material such as rubber, has a substantially hexagonal shape in plan view, and has a regular hexagonal insertion hole 35a formed therein. The second retainer 35 includes an annular portion 35B, six third projections 35C, and six fourth projections 35D.

Into the insertion holes 34c of inner portions 34A of the individual second levers 34, the third projections 35C of the second retainer 35 are inserted to allow each of the second levers 34 to be held by the second retainer 35. Each of the second levers 34 is disposed between the fourth projections 35D adjacent to each other to have rotation thereof suppressed.

Into the regular hexagonal insertion hole 35a of the second retainer 35, the regular hexagonal prism portion 7E1 of the stem 7 is inserted. Since the insertion hole 35a has a size slightly larger than that of the outer shape of the regular hexagonal prism portion 7E1, the rotation of the second retainer 35 relative to the regular hexagonal prism portion 7E1 is suppressed.

Subsequently, an opening/closing operation of the valve device 1 according to this embodiment will be described.

Figure 4:
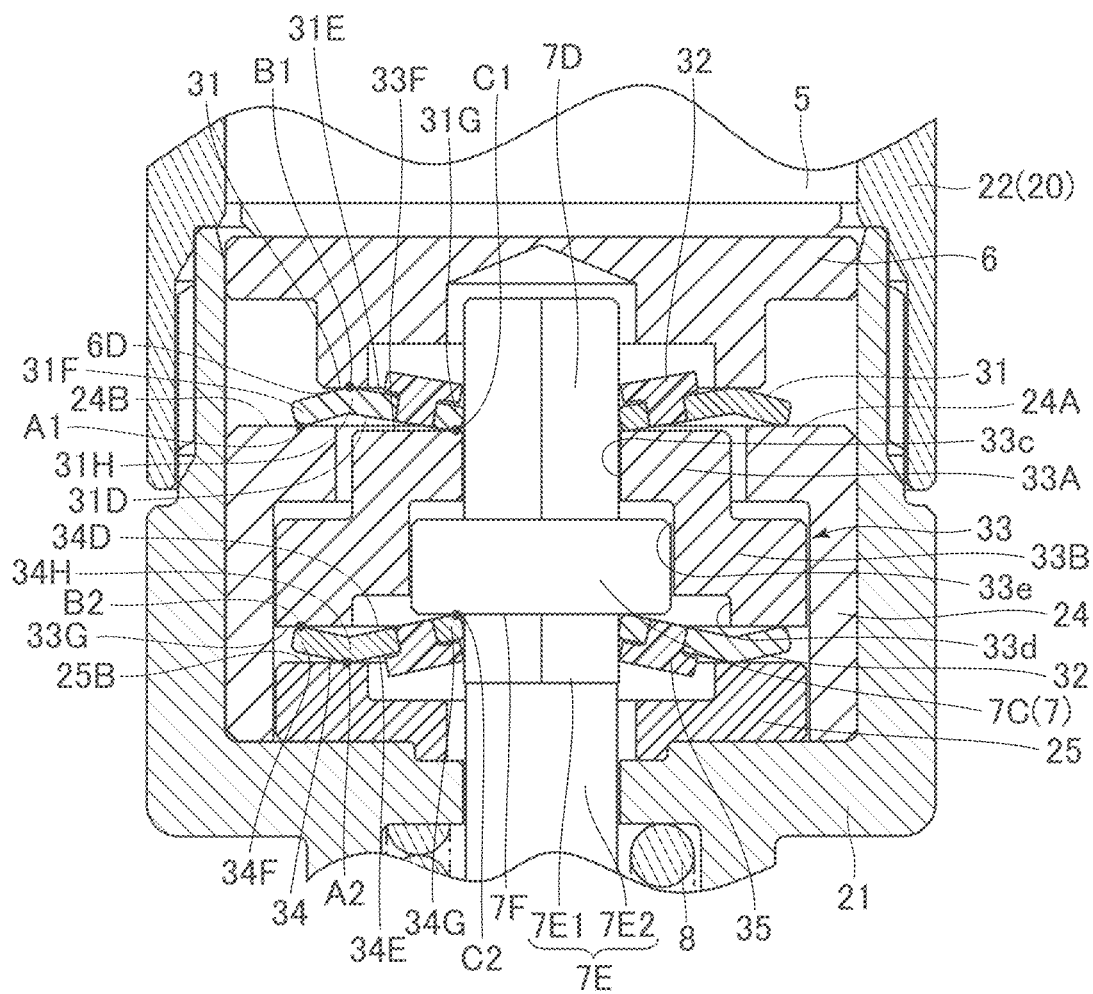
FIG. 4 is a cross-sectional view of the displacement amplification mechanism when the valve device is in an open state.

FIG. 3 illustrates a cross-sectional view of the displacement amplification mechanism 30 when the valve device 1 is in a closed state. FIG. 4 illustrates a cross-sectional view of the displacement amplification mechanism 30 when the valve device 1 is in an open state.

As illustrated in FIG. 1, when the valve device 1 is in the closed state, a predetermined voltage is not applied to the piezoelectric element 5, and the stem 7 is biased downward by the coil spring 8 and is located at a lowest end. When the valve device 1 is brought into the open state illustrated in FIG. 4 from the closed state illustrated in FIGS. 1 and 3, the predetermined voltage is applied to the piezoelectric element 5, and deformation (displacement) of the piezoelectric element 5 is transmitted to the disc 6. By means of movement (displacement) of the disc 6 to the lower side, the bent portion 31H of each of the first levers 31 is pressed by the lower surface 6D of the disc 6, and each of the first levers 31 rotationally moves around the outer end portion 31F in contact with the upper surface 24B of the projecting portion 24A of the first support ring 24. As a result, the inner end portion 31G of each of the first levers 31 moves to the lower side, the upper surface 33F of the intermediate member 33 is pressed, and the intermediate member 33 moves to the lower side.

When the intermediate member 33 moves to the lower side, an outer end portion 34F of each of the second levers 34 is pressed by the lower surface 33G of the intermediate member 33, and each of the second levers 34 is rotationally moved around a bent portion 34H of each of the second levers 34. As a result, an inner end portion 34G of each of the second levers 34 moves to the upper side, the lower surface 7F of the disc portion 7C of the stem 7 is pressed, and the stem 7 moves to the upper side against a biasing force of the coil spring 8. As a result, there is no force for pressing the diaphragm 3 any longer, the diaphragm 3 is pushed up by a pressure of a fluid flowing through the inflow passage 2b and a recovering force of the diaphragm 3 itself and is separated from the seat 2D, whereby the inflow passage 2b and the outflow passage 2c communicate with each other.

On the other hand, when the valve device 1 is brought into the closed state illustrated in FIGS. 1 and 3 from the open state illustrated in FIG. 4, the application of the predetermined voltage to the piezoelectric element 5 is cancelled, and the piezoelectric element 5 returns to an original state. Thus, since the force for pushing up the stem 7 by the displacement amplification mechanism 30 does not work any longer, the stem 7 and the diaphragm 3 are pressed by the biasing force of the coil spring 8 and are brought into contact with the seat 2D, whereby the communication between the inflow passage 2b and the outflow passage 2c is shut off.

In this embodiment, the displacement of the disc 6 caused by the deformation of the piezoelectric element 5 is amplified by the displacement amplification mechanism 30 and is transmitted to the stem 7. That is, assuming that a contact portion A1 of the outer end portion 31F of the first lever 31 to the upper surface 24B of the first support ring 24 is a fulcrum, a contact portion B1 of the bent portion 31H of the first lever 31 to the lower surface 6D of the disc 6 is a point of effort, and a contact portion C1 of the inner end portion 31G of the first lever 31 to the upper surface 33F of the intermediate member 33 is a point of load, a distance between the contact portion A1 and the contact portion C1 in a direction orthogonal to an axis of the stem 7 is configured to be several times (approximately 3.5 times in this embodiment) the distance between the contact portion A1 and the contact portion B1. Thus, the displacement of the inner end portion 31G of the first lever 31 becomes approximately 3.5 times the displacement of the bent portion 31H of the first lever 31, that is, the displacement of the disc 6 caused by the deformation of the piezoelectric element 5 by means of the principle of leverage.

Moreover, by assuming that a contact portion A2 of the bent portion 34H of the second lever 34 to the upper surface 25B of the second support ring 25 is the fulcrum, a contact portion B2 of the outer end portion 34F of the second lever 34 to the lower surface 33G of the intermediate member 33 is the point of effort, and a contact portion C2 of the inner end portion 34G of the second lever 34 to the lower surface 7F of the disc portion 7C in the stem 7 is the point of load, the distance between the contact portion A2 and the contact portion B2 in the direction orthogonal to the axis of the stem 7 is configured to be several times (approximately 3.5 times in this embodiment) the distance between the contact portion A2 and the contact portion C2. Thus, the displacement of the inner end portion 34G of the second lever 34 becomes approximately 3.5 times the displacement of the outer end portion 34F of the second lever 34 by means of the principle of leverage. Therefore, the displacement of the inner end portion 34G of the second lever 34 becomes approximately 12 times the displacement of the disc 6 caused by the deformation of the piezoelectric element 5.

As described above, it is configured such that the displacement of the disc 6 caused by the deformation of the piezoelectric element 5 is amplified by the displacement amplification mechanism 30 so as to move the stem 7 to the upper side. As a result, even if the displacement amount (20 μm, for example) of the piezoelectric element 5 is small, the displacement amount of the stem 7 can be made larger. Moreover, the inner end portion 34G of each of the second levers 34 is displaced toward the piezoelectric element 5 by the displacement of the piezoelectric element 5 by application of a voltage, whereby the stem 7 moves toward the piezoelectric element 5. As a result, the valve device 1 in the normally closed state can be brought to the open state.

In the first lever 31, the outer end portion 31F corresponds to a first fulcrum portion, the bent portion 31H to a first point-of-effort portion, and the inner end portion 31G to a first point-of-load portion. In the second lever 34, the outer end portion 34F corresponds to a second point-of-effort portion, the bent portion 34H to a second fulcrum portion, and the inner end portion 34G to a second point-of-load portion.

As described above, according to the valve device 1 including the actuator 4 of this embodiment, in the displacement amplification mechanism 30, in the direction orthogonal to the axis of the stem 7, the bent portion 31H which is the first point-of-effort portion is located between the outer end portion 31F which is the first fulcrum portion and the inner end portion 31G which is the first point-of-load portion, the bent portion 34H which is the second fulcrum portion is located between the outer end portion 34F which is the second point-of-effort portion and the inner end portion 34G which is the second point-of-load portion, and the distance between the bent portion 34H and the inner end portion 34G is configured longer than the distance between the bent portion 34H and the outer end portion 34F. By means of the displacement of the intermediate member 33 toward each of the second levers 34 side, the inner end portion 34G of each of the second levers 34 is displaced toward the piezoelectric element 5 so as to move the stem 7 toward the piezoelectric element 5. Thus, the displacement of the piezoelectric element 5 can be amplified, and the stem 7 can be displaced to the piezoelectric element 5 side by the displacement of the piezoelectric element 5. Therefore, the valve device 1 in the normally closed state can be provided.

The displacement amplification mechanism 30 has a plurality of the first levers 31 and a plurality of the second levers 34 and thus, by disposing the plurality of levers at an equal interval along a circumferential direction of the stem 7, transmission of the force from the piezoelectric element 5 to the stem 7 via the intermediate member 33 can be performed uniformly, and the displacement of the piezoelectric element 5 can be transmitted to the stem 7 smoothly.

Moreover, since the plurality of first levers 31 is held by the first retainers 32, and the plurality of second levers 34 is held by the second retainers 35, assembling performance of the actuator 4 and the valve device 1 can be improved.

Next, a description will be given of the fluid control apparatus 55 in which the valve devices 1 described above are to be used and of a semiconductor manufacturing device 60 including the fluid control apparatus 55.

Figure 5:
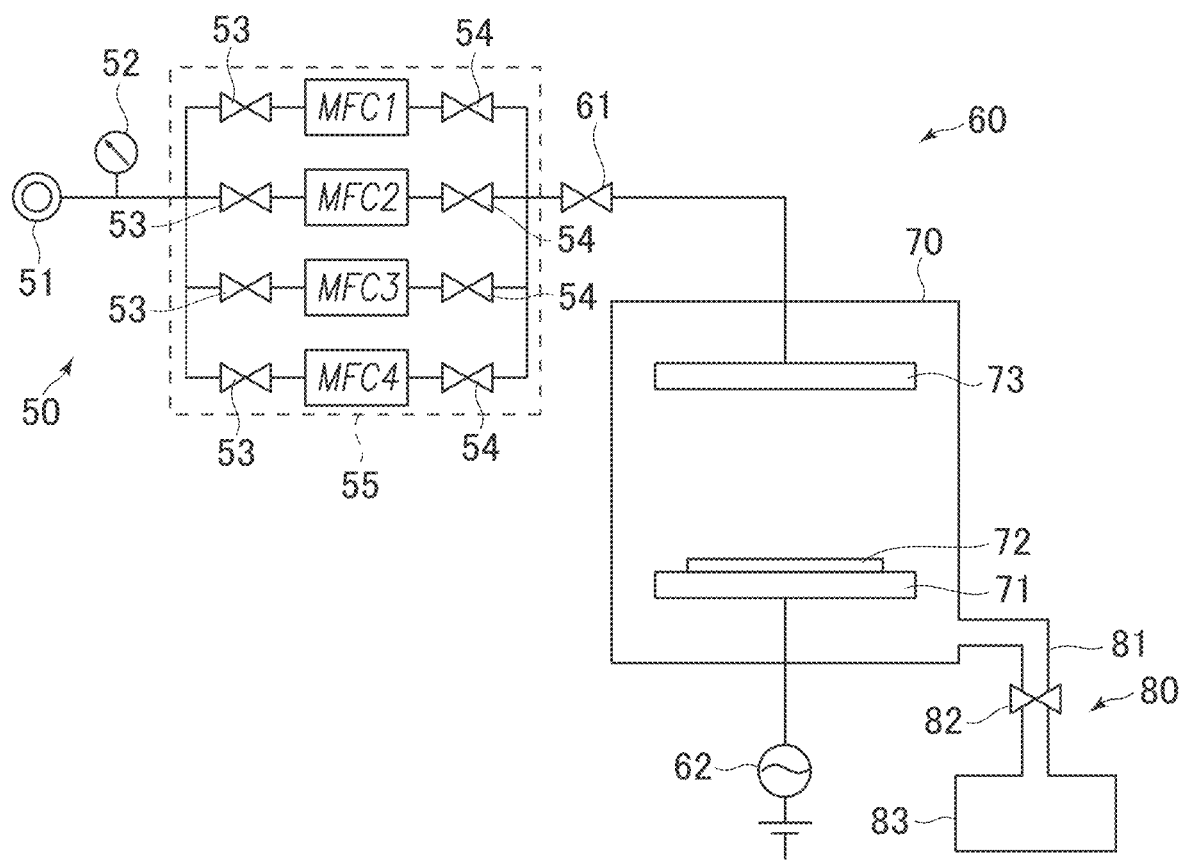
FIG. 5 illustrates a schematic diagram of a semiconductor manufacturing device.

FIG. 5 is a schematic diagram of the semiconductor manufacturing device 60. For example, the semiconductor manufacturing device 60 is a CVD device which includes a gas supply part 50 including the fluid control apparatus 55, a vacuum chamber 70, and an exhaust part 80 and forms a passivation film (oxide film) over a wafer.

The gas supply part 50 includes a gas supply source 51, a manometer 52, and the fluid control apparatus 55. The fluid control apparatus 55 has a plurality of gas lines formed of a plurality of fluid controllers and includes, as the fluid controllers, open/close valves 53 and 54 and mass flow controllers (MFCs) 1 to 4. Between the gas supply part 50 and the vacuum chamber 70, an open/close valve 61 is provided. The vacuum chamber 70 includes a mounting table 71 for mounting thereon a wafer 72 and an electrode 73 for forming a thin film over the wafer 72. The vacuum chamber 70 is connected to a commercial power source 62. The exhaust part 80 includes an exhaust pipe 81, an open/close valve 82, and a dust collector 83.

When a thin film is formed over the wafer 72, by opening/closing the open/close valves 53, 54, and 61 and using the MFCs 1 to 4, a supply of the gas to the vacuum chamber 70 is controlled. When a powder and granular material generated as a by-product during the formation of the thin film over the wafer 72 is to be removed, the open/close valve 82 is brought into an open state, and the powder and granular material is removed by the dust collector 83 via the exhaust pipe 81.

To the open/close valves 53, 54, 61, and 82, the valve devices 1 according to the embodiments described above can be applied. As described above, each of the valve devices 1 has the excellent durability, and accordingly it is possible to provide the fluid control apparatus 55 having excellent durability.

While the description has been given heretofore of the case where the semiconductor manufacturing device 60 is the CVD device, the semiconductor manufacturing device 60 may also be a sputtering device or an etching device. The etching device (dry etching device) includes a processing chamber, a gas supply part (fluid control apparatus), and an exhaust part and processes a surface of a material or the like using a corrosive action exerted by a reactive gas. The sputtering device includes a target, a vacuum chamber, a gas supply part (fluid control apparatus), and an exhaust part and deposits a film over a surface of a material.

This embodiment is not limited to the embodiment described above. A person ordinarily skilled in the art could have made various additions, changes and the like within the range of the present disclosure.

For example, the displacement amplification mechanism 30 in the aforementioned embodiment includes the six first levers 31, the first retainers 32, the intermediate member 33, the six second levers 34, and the second retainers 35, but the first retainers 32 and the second retainers 35 may be omitted. Moreover, the first lever portion and the second lever portion are configured of six independent members, respectively, but the six first levers 31 or the six second levers 34 may have an integral structure connected on inner peripheral edges or outer peripheral edges thereof. In this case, the first lever 31 or the second lever 34 may be configured of a material such as metal, resin and the like which are deformed with the displacement of the disc 6 and the intermediate member 33. Moreover, the displacement amplification mechanism 30 has the six first levers 31 and the six second levers 34, but the numbers thereof only need to be two or more, respectively.

Moreover, the coil spring 8 may be configured of a disc spring. A valve seat is configured of burying the annular seat 2D made of a resin, but the valve seat may be configured of forming an annular projecting portion by the same metal material as that of the body 2.

What is claimed is:
1. An actuator, comprising:
    a casing;
    a stem provided in the casing;

a piezoelectric element supported by the casing to be displaced toward the stem; and a displacement amplification mechanism configured to amplify displacement of the piezoelectric element, wherein the displacement amplification mechanism includes a first lever portion, an intermediate member, and a second lever portion;

the first lever portion is located between the piezoelectric element and the intermediate member and includes a first point-of-effort portion configured to receive displacement from the piezoelectric element, a first fulcrum portion which is in contact with the casing and becomes a center of rotational movement of the first lever portion, and a first point-of-load portion configured to transmit displacement to the intermediate member;

the intermediate member is located between the first lever portion and the second lever portion and is configured to be displaced toward the second lever portion upon receipt of displacement from the first lever portion; and the second lever portion has a second point-of-effort portion configured to receive displacement from the intermediate member, a second fulcrum portion which is in contact with the casing and becomes the center of rotational movement of the second lever portion, and a second point-of-load portion configured to transmit the displacement to the stem;

the first point-of-effort portion is located between the first fulcrum portion and the first point-of-load portion in a direction orthogonal to an axis of the stem;

the second fulcrum portion is located between the second point-of-effort portion and the second point-of-load portion in the direction orthogonal to the axis of the stem;

a distance between the second fulcrum portion and the second point-of-load portion is configured longer than a distance between the second fulcrum portion and the second point-of-effort portion; and the second point-of-load portion of the second lever portion is displaced toward the stem and moves the stem toward the piezoelectric element by means of displacement of the intermediate member to the second lever portion side.

2. The actuator according to claim 1, wherein
the first lever portion has a plurality of first levers disposed along a circumferential direction of the stem; and
the second lever portion has a plurality of second levers disposed along the circumferential direction of the stem.

3. The actuator according to claim 2, wherein
the displacement amplification mechanism includes a first retainer configured to hold the plurality of first levers and a second retainer configured to hold the plurality of second levers.

4. A valve device, comprising:
a body in which a fluid passage is formed;
a valve body configured to open and close the fluid passage; and
the actuator according to claim 1.

5. A fluid control apparatus, comprising a plurality of fluid control devices, wherein
at least one of the plurality of fluid control devices is the valve device according to claim 4.

* * * * *